July 4, 1961 J. B. FORCE 2,991,429
PULSE GENERATOR CIRCUIT
Filed Sept. 8, 1958
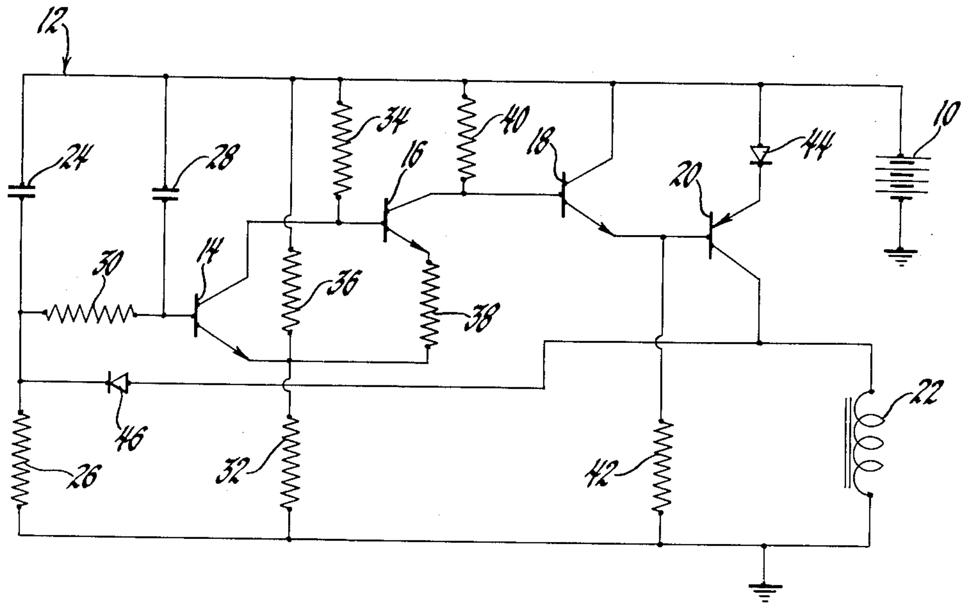
INVENTOR.
John B. Force
BY
Paul J. Ethington
ATTORNEY

United States Patent Office 2,991,429

Patented July 4, 1961

2,991,429

PULSE GENERATOR CIRCUIT

John B. Force, Bancroft, Mich., assignor to General Motors Corporation, Detroit, Mich., a corporation of Delaware Filed Sept. 8, 1958, Ser. No. 759,579
2 Claims. (Cl. 331—111)

This invention relates to electronic circuits and more particularly to the type known as pulse generators.

In accordance with this invention, there is provided a pulse generator of simple circuit design which is capable of delivering pulses of relatively high power to a load device at a selected repetition rate and pulse duration. This is preferably accomplished by a resistance-capacitance timing circuit for controlling the conduction of a transistor amplifier. The timing circuit comprises a condenser to control the "on time" and may include another condenser to control the "off time" and the condensers are discharged through a rectifying device upon a change of conduction through the load device whereby the timing circuit is reset to initiate a new cycle.

A more complete understanding of the invention may be had from the detailed description which follows taken with the accompanying drawing in which the single figure is a schematic diagram of an illustrative embodiment of the inventive pulse generator.

In general, the pulse generator comprises a direct voltage source or battery 10 and a timing circuit 12 which controls the conduction of the transistor amplifiers 14, 16, 18 and 20 which are alternately conductive and nonconductive to deliver output pulses to a load device or inductance coil 22. The timing circuit 12 includes a first timing condenser 24 and resistor 26 connected in series across the battery 10. It also includes a timing condenser 28 and resistor 30 connected across the condenser 24. The condenser 28 is of relatively low value and, as will be explained hereinafter, controls the "on time" or pulse duration of the output pulses while the condenser 24 is of relatively high value and controls the "off time" or interval between the output pulses. The transistor amplifier 14 has an input circuit extending between the base and emitter electrodes through the resistor 30, the resistor 26, and an emitter circuit resistor 32. The output circuit of the amplifier 14 extends between the collector and emitter electrodes and includes the battery 10, a collector circuit resistor 34 and the emitter circuit resistor 32. The input circuit of transistor 14 is biased in the non-conductive direction by the voltage across resistor 32 which is connected in series with a resistor 36 as a voltage divider across the battery 10.

The transistor amplifier 16 has an input circuit which extends between its base and emitter electrodes and is connected across the collector and emitter electrodes of the amplifier 14 through an emitter circuit resistor 38. An input circuit bias current path is provided through resistor 34, base to emitter of transistor 16, resistor 38 and resistor 32. The output circuit of the amplifier 16, extending between collector and emitter electrodes, includes the battery 10, a resistor 40, emitter circuit resistor 38 and resistor 32. The amplifier 18 has an input circuit, extending from base to emitter electrodes, connected across the collector electrode of amplifier 16 and ground through a resistor 42. Base to emitter bias current is supplied through resistors 40 and 42. The output circuit of amplifier 18 extends from the collector to the emitter electrode, through the battery 10 and the resistor 42 to ground. The input circuit of the amplifier 20 extending between emitter to base electrodes is connected across the collector and emitter electrodes of the amplifier 18 and includes a crystal diode 44 which provides emitter circuit resistance and affords temperature stability for the circuit. The output circuit of the amplifier 20 is connected between the emitter and collector electrodes and includes the load device or inductance coil 22 and the battery 10 in series. A reset circuit to permit discharge of the timing condensers 24 and 28 includes a rectifying device such as a crystal diode 46 connected between the upper terminal of the coil 22 and the upper terminal of the resistor 26.

In operation, the voltage of battery 10 is applied across the timing circuit 12 and causes a charging current to flow through the condensers 24 and 28. Disregarding the effect of condenser 28 for the moment, as though it were disconnected, the charging current for condenser 24 flows through the resistor 26 to ground and through resistor 30, the base to emitter of the transistor amplifier 14, and thence through resistor 32 to ground. During this charging interval the base to emitter current of amplifier 14 renders its output circuit conductive from collector to emitter. Accordingly, the base to emitter circuit of transistor amplifier 16 is short-circuited thereby and the base to emitter current is reduced sufficiently to cut off the amplifier 16. Consequently, sufficient input current in transistor amplifier 18 flows through resistor 40 and thence through base to emitter and resistor 42 to cause its output circuit to be conductive. This produces a bias voltage in the input circuit of amplifier 20 across the resistor 42 which maintains its output circuit non-conductive and the coil 22 remains deenergized during this charging interval of the timing circuit.

When the condenser 24 is sufficiently charged so that voltage on the base electrode of transistor amplifier 14 is approximately equal to the bias voltage developed across resistor 32, the transistor amplifier 14 cuts off. Consequently, in transistor amplifier 16, input circuit current flows from base to emitter and its output circuit becomes conductive which increases the voltage across resistor 32 at the emitter electrode and positive switching action of amplifier 14 is achieved. This reduces the base to emitter current in amplifier 18 sufficiently to cut off conduction in its output circuit removing the bias voltage across resistor 42 and causing the output circuit of amplifier 20 to become conductive to energize the coil 22. When the output circuit of the amplifier 20 becomes conductive, a discharge path for the timing condenser 24 is provided through the diode 44, the emitter to collector electrodes of the amplifier 20, and thence through the diode 46. Accordingly, the voltage across the condenser 28 decreases with an attendant increase of voltage at the base electrode of the amplifier 14. When condenser 24 is discharged sufficiently that the base voltage exceeds the emitter voltage, the amplifier 14 is biased on and amplifier 16 is cut off, which biases on amplifier 18 and cuts off amplifier 20 to deenergize the coil 22. Thus, the cycle is completed and the timing circuit 12 is reset for the initiation of a succeeding cycle. In this arrangement, i.e. without the effect of condenser 28, the pulse is of short duration, in the form of a spike, and the "off time" and pulse repetition rate are determined largely by the value of condenser 24 and resistor 26.

When both of the condensers 24 and 28 are utilized in the circuit, the condenser 24 controls the "off time" and the condenser 28 controls the "on time" or pulse duration. During the charging interval the charging circuit for condenser 24 is the same as that described previously and the condenser 28 is charged through the resistors 30 and 26 and through the base to emitter electrodes and resistor 32 of amplifier 14. When the condensers are charged sufficiently that the base voltage is substantially equal to the emitter voltage, the amplifier 14 is cut off causing amplifier 16 to be conductive, amplifier 18 to be cut off and amplifier 20 to be conductive which energizes the coil 22. When the amplifier 20 is conductive, the discharge path for the condensers is completed through the diode 46. Since the discharge path for the condenser 28 includes the resistor 30, the transistor amplifier 14 is maintained at cut off for a period determined by the time constant of this discharge circuit. Accordingly, the condenser 28 controls the "on time" or pulse duration and provides a prolonged output pulse across the coil 22.

Although the description of this invention has been given with respect to a particular embodiment, it is not to be construed in a limiting sense. Numerous variations and modifications within the spirit and scope of the invention will now occur to those skilled in the art. For a definition of the invention, reference is made to the appended claims.

I claim:

1. A pulse generator comprising a voltage source, a timing circuit including a condenser and a resistor connected in series across the source, a bias resistor connected across the source, a first transistor having an input circuit including the bias resistor and the timing circuit resistor and having an output circuit connected across the source, the charging current for the condenser through the input circuit causing the output circuit to be conductive, a second transistor having an input circuit connected with the output circuit of the first transistor and having an output circuit connected across the source and being non-conductive when the first transistor is conductive, said output circuit of the second transistor including the bias resistor, a third transistor having its input circuit connected across the output circuit of the second transistor and having an output circuit connected across the source, a fourth transistor having an input circuit connected across the output circuit of the third transistor and having an output circuit connected across the source, a load device coupled with the output circuit of the fourth transistor, the first and third transistors becoming non-conductive and the second and fourth transistors becoming conductive when the condenser is charged to a voltage determined by the voltage across the bias resistor, the conduction of the output circuit of the second transistor increasing the voltage across the bias resistor to aid the switching action of the transistors and produce a pulse across the load device, and a rectifying device connected across the condenser through the output circuit of the fourth transistor whereby the condenser is discharged when the fourth transistor becomes conductive.

2. A pulse generator comprising a voltage source, a timing circuit including a first condenser and first resistor connected in series across the source and a second condenser and second resistor connected in series across the first condenser, a first amplifier having its input circuit connected across said resistors and having its output circuit connected across the source whereby it is conductive during the charging interval of the condensers, a second amplifier having its input circuit connected with the output circuit of the first amplifier and having its output circuit connected across the source whereby it is non-conductive during the charging interval of the condensers, a load device connected in the output circuit of the second amplifier, said first amplifier becoming non-conductive and the second amplifier becoming conductive upon the termination of said charging interval whereby a pulse is developed across the load device, and a discharge circuit for the condensers including a rectifying device and the output circuit of the second amplifier, the discharge circuit for the second condenser including the second resistor and being effective to prolong the pulse duration across the load device.

References Cited in the file of this patent

UNITED STATES PATENTS

| | | |
|---|---|---|
| 2,787,712 | Priebe et al. | Apr. 2, 1957 |
| 2,841,712 | Hoge et al. | July 1, 1958 |
| 2,845,547 | Althouse | July 29, 1958 |
| 2,866,104 | Biggam | Dec. 23, 1958 |